United States Patent
Kuan et al.

(10) Patent No.: US 10,855,292 B2
(45) Date of Patent: *Dec. 1, 2020

(54) PHASE LOCKED LOOP

(71) Applicant: Taiwan Semiconductor Manufacturing Co., Ltd., Hsinchu (TW)

(72) Inventors: Ting-Kuei Kuan, Taichung (TW); Cheng-Hsiang Hsieh, Taipei (TW); Chen-Ting Ko, Hsinchu (TW); Ruey-Bin Sheen, Taichung (TW); Chih-Hsien Chang, New Taipei (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/723,205

(22) Filed: Dec. 20, 2019

(65) Prior Publication Data
US 2020/0127668 A1 Apr. 23, 2020

Related U.S. Application Data

(63) Continuation of application No. 15/490,096, filed on Apr. 18, 2017, now Pat. No. 10,523,218.

(51) Int. Cl.
*H03L 7/089* (2006.01)
*H03K 7/08* (2006.01)
(Continued)

(52) U.S. Cl.
CPC ............ *H03L 7/0891* (2013.01); *H03K 7/08* (2013.01); *H03L 7/087* (2013.01); *H03L 7/091* (2013.01);
(Continued)

(58) Field of Classification Search
CPC ......... H03L 7/08; H03L 7/085; H03L 7/0891; H03L 7/091; H03L 7/093; H03L 7/099
(Continued)

(56) References Cited

U.S. PATENT DOCUMENTS

| 5,592,456 A | 1/1997 | Miyashita et al. |
| 6,727,768 B1 | 4/2004 | Dasgupta |

(Continued)

FOREIGN PATENT DOCUMENTS

EP     0 840 456 A2     5/1998

OTHER PUBLICATIONS

Kuan, T.K., et al.; "A Bang-Bang Phase-Locked Loop Using Automatic Loop Gain Control and Loop Latency Reduction Techniques;" IEEE Journal of Solid-State Circuits; vol. 51; No. 4; Apr. 2016; pp. 821-831.

(Continued)

*Primary Examiner* — Diana J. Cheng
(74) *Attorney, Agent, or Firm* — McClure, Qualey & Rodack, LLP.

(57) ABSTRACT

Phase-locked loops (PLLs) are provided. A PLL includes a voltage-controlled oscillator (VCO), a frequency divider, a track-and-hold charge pump, and a frequency tracking circuit. The VCO is configured to provide an output clock corresponding to a pumping current. The frequency divider is configured to divide the output clock to provide a feedback signal. The track-and-hold charge pump is configured to provide the pumping current according to a reference clock and the feedback signal. The frequency tracking circuit is configured to decrease frequency error between the feedback signal and the reference clock. The track-and-hold charge pump includes a pumping switch and a pulse width modulator (PWM). The PWM is configured to provide a PWM signal to control the pumping switch according to the (Continued)

reference clock, so as to provide the pumping current corresponding to the feedback signal.

20 Claims, 13 Drawing Sheets

(51) Int. Cl.
  *H03L 7/091*  (2006.01)
  *H03L 7/099*  (2006.01)
  *H03L 7/093*  (2006.01)
  *H03L 7/087*  (2006.01)
  *H03L 7/097*  (2006.01)

(52) U.S. Cl.
  CPC .............. *H03L 7/093* (2013.01); *H03L 7/097* (2013.01); *H03L 7/099* (2013.01)

(58) Field of Classification Search
  USPC ........................................ 327/157, 536–538
  See application file for complete search history.

(56) References Cited

U.S. PATENT DOCUMENTS

| | | |
|---|---|---|
| 2008/0231484 A1 | 9/2008 | Moore et al. |
| 2015/0162921 A1 | 6/2015 | Chen et al. |
| 2015/0170816 A1 | 6/2015 | Liu et al. |
| 2015/0280556 A1 | 10/2015 | Bari et al. |
| 2016/0105194 A1 | 4/2016 | Kumbaranthodiyil et al. |
| 2017/0059325 A1* | 3/2017 | Shiono ...................... B60T 7/22 |
| 2017/0272005 A1 | 9/2017 | Chen et al. |
| 2017/0357284 A1 | 12/2017 | Lin |

OTHER PUBLICATIONS

Kuan, T.K., et al.; A Digital Bang-Bang Phase-Locked Loop with Automatic Loop Gain Control and Loop Latency Reduction; Symposium on VLSI Circuits Digest of Technical Papers; 2015; pp. C138-C139.

Kuan, T.K., et al.; "A Loop Gain Optimization Technique for Integer-N TDC-Based Phase-Locked Loops;" IEEE Transactions on Circuits and Systems-I: Regular Papers; vol. 62; No. 7; Jul. 2015; pp. 1873-1882.

Gao, X., et al.; "A Low Noise Sub-Sampling PLL in Which Divider Noise is Eliminated and PD/CP Noise is Not Multiplied by N2;" IEEE Journal of Solid-State Circuits; vol. 44; No. 12; Dec. 2009; pp. 3253-3263.

Gao, X., et al.; "Spur Reduction Techniques for Phase-Locked Loops Exploiting a Sub-Sampling Phase Detector;" IEEE Journal of Solid-State Circuits; vol. 45; No. 9; Sep. 2010; pp. 1809-1821.

* cited by examiner

PHASE LOCKED LOOP

CROSS REFERENCE TO RELATED APPLICATIONS

This Application is a Continuation of U.S. application Ser. No. 15/490,096, filed on Apr. 18, 2017, now U.S. Pat. No. 10,523,218, the entirety of which is incorporated by reference herein.

BACKGROUND

Phase locked loops (PLL) are commonly used in circuits that generate a high-frequency signal with a frequency being a multiple of the frequency of a reference signal. PLLs can also be found in applications where the phase of the output signal tracks the phase of the reference signal, hence the name phase-locked loop. For example, a PLL can be used in the frequency synthesizer of a radio receiver or transmitter for generating a local oscillator signal, which is a multiple of a stable, low-noise and often temperature-compensated reference signal. In another example, a PLL can be used for clock recovery applications in digital communication systems, disk-drive read-channels, etc.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
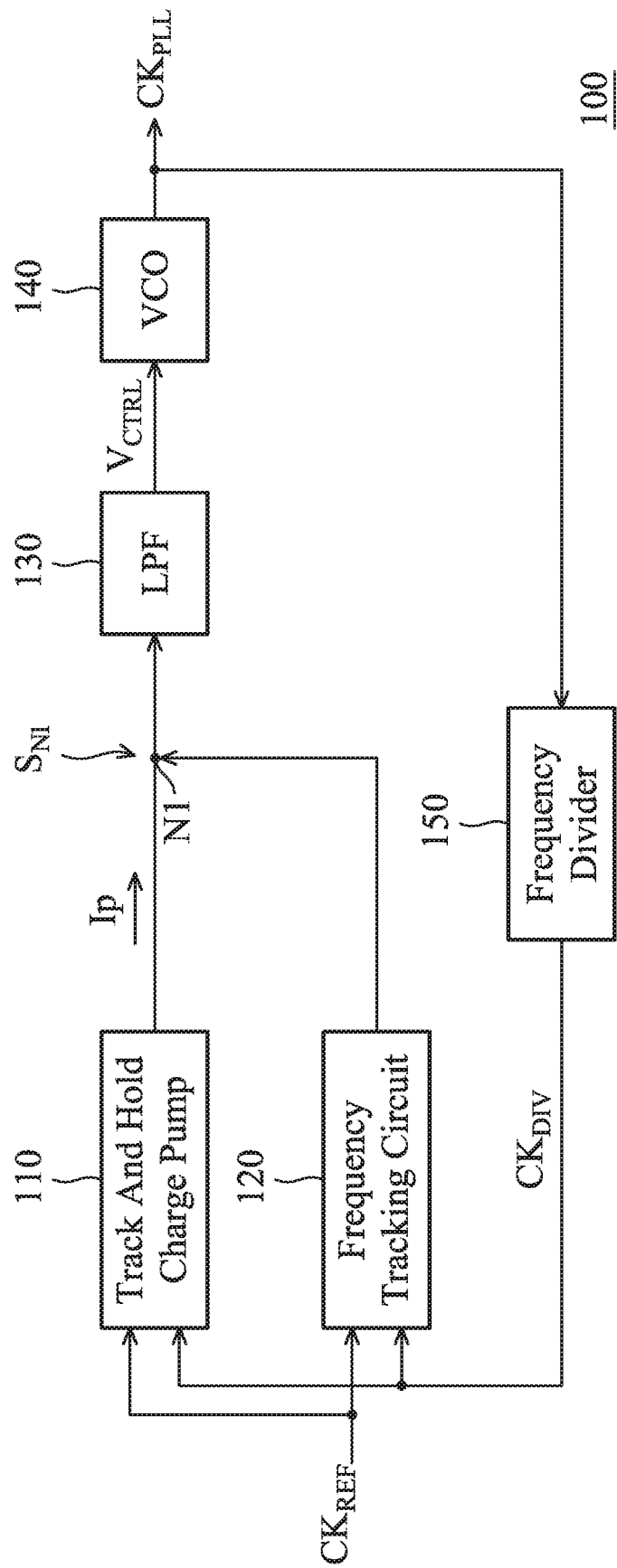
FIG. 1 shows a phase-locked loop (PLL), in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. In some embodiments, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

FIG. 1 shows a phase-locked loop (PLL) 100, in accordance with some embodiments of the disclosure. The PLL 100 is an analog PLL capable of multiplying a low-frequency reference clock $CK_{REF}$ to generate a high-frequency output clock $CK_{PLL}$. The PLL 100 includes a track and hold (T/H) charge pump 110, a frequency tracking circuit 120, a low pass filter 130, a voltage-controlled oscillator (VCO) 140, and a frequency divider 150.

The track and hold charge pump 110 is coupled between the frequency divider 150 and a node N1. The track and hold charge pump 110 compares the phases of a feedback signal $CK_{DIV}$ from the frequency divider 150 and the reference clock $CK_{REF}$, to generate a pumping current Ip, and the pumping current Ip is proportional to the difference between the phases of the feedback signal $CK_{DIV}$ and the reference clock $CK_{REF}$.

The frequency tracking circuit 120 is also coupled between the frequency divider 150 and the node N1. The frequency tracking circuit 120 is capable of presetting the output clock $CK_{PLL}$ at target frequency, e.g. decreasing the frequency error between the feedback signal $CK_{DIV}$ and the reference clock $CK_{REF}$. The frequency tracking circuit 120 provides a frequency-locked loop (FLL) for the VCO 140. In some embodiments, the FLL has a larger gain than a core loop formed by the track and hold charge pump 110, the LPF 130, the VCO 140 and the frequency divider 150. After locking frequency is achieved, the frequency error between the feedback signal $CK_{DIV}$ and the reference clock $CK_{REF}$ is small, and then the frequency tracking circuit 120 can be disabled to save power.

The LPF 130 is coupled between the node N1 and the VCO 140. The LPF 130 is capable of filtering a pumping signal $S_{N1}$ corresponding to the pumping current Ip at the node N1, to generate a control voltage $V_{CTRL}$ to the VCO 140.

The VCO 140 is coupled between the LPF 130 and the frequency divider 150. The VCO 140 is capable of generating the output clock $CK_{PLL}$ according to the control voltage $V_{CTRL}$.

The frequency divider 150 is coupled to the VCO 140, and is capable of dividing the output clock $CK_{PLL}$ to obtain the feedback signal $CK_{DIV}$, and providing the feedback signal $CK_{DIV}$ to the track and hold charge pump 110 and the frequency tracking circuit 120.

In some embodiments, the frequency divider 150 is capable of providing a pair of different feedback signals $CK_{DIV+}$ and $CK_{DIV-}$ to the track and hold charge pump 110 and the frequency tracking circuit 120. For example, if the feedback signal $CK_{DIV+}$ is identical to the feedback signal $CK_{DIV}$, the feedback signal $CK_{DIV-}$ is complementary to the feedback signal $CK_{DIV}$. Conversely, if the feedback signal $CK_{DIV-}$ is identical to the feedback signal $CK_{DIV}$, the feedback signal $CK_{DIV+}$ is complementary to the feedback signal $CK_{DIV}$.

Figure 2A:
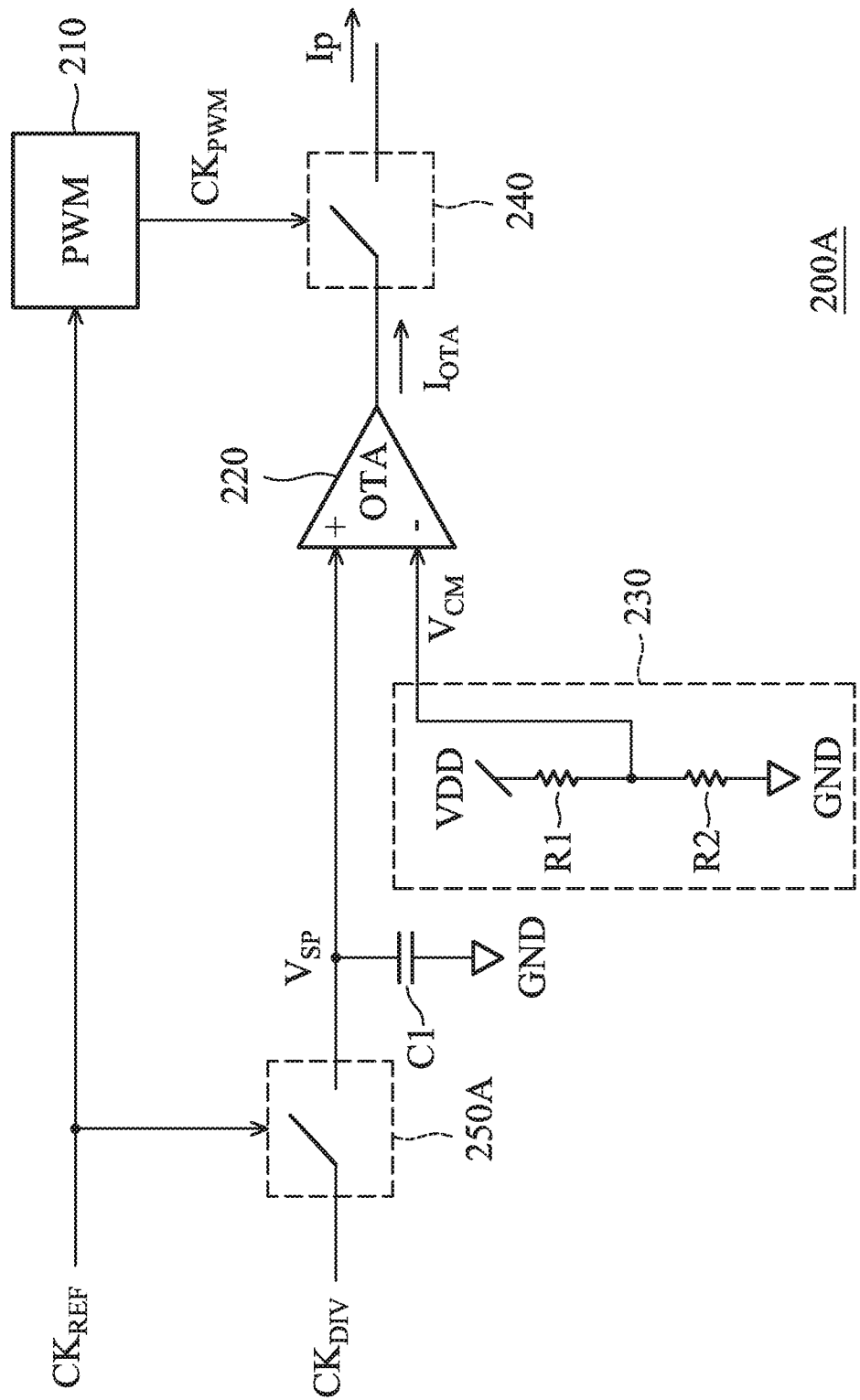
FIG. 2A shows a track and hold charge pump, in accordance with some embodiments of the disclosure.

FIG. 2A shows a track and hold charge pump 200A illustrating an exemplified block diagram of the track and hold charge pump 110 of FIG. 1, in accordance with some embodiments of the disclosure. The track and hold charge pump 200A includes a pulse width modulator (PWM) 210, a pumping switch 240, a transconductance amplifier (OTA) 220, a sampling switch 250A, a capacitive element C1 (e.g. a capacitor), and a voltage divider 230.

The sampling switch 250A is a sample-and-hold circuit coupled to the capacitive element C1 and a non-inverting input terminal of the OTA 220, and the capacitive element C1 is coupled between the non-inverting input terminal of the OTA 220 and a ground GND. The sampling switch 250A is controlled by the reference clock $CK_{REF}$. When the sampling switch 250A is turned on by the reference clock $CK_{REF}$, the feedback signal $CK_{DIV}$ is sampled and stored in the capacitive element C1 as a voltage $V_{SP}$.

The OTA 220 has a non-inverting input terminal for receiving the voltage $V_{SP}$ stored in the capacitive element C1 and an inverting input terminal for receiving a reference voltage $V_{CM}$. The OTA 220 is capable of converting a voltage difference between the voltage $V_{SP}$ and the reference voltage $V_{CM}$ into a current $I_{OTA}$. In such embodiments, the OTA 220 is operated in the single-ended form (or mode).

In some embodiments, the reference voltage $V_{CM}$ is provided by the voltage divider 230. The voltage divider 230 includes a resistor R1 coupled between a power supply VDD and the inverting input terminal of the OTA 220, and a resistor R2 coupled between a ground GND and the inverting input terminal of the OTA 220. In some embodiments, the reference voltage $V_{CM}$ is provided by a reference circuit, such as a band gap circuit.

The PWM 210 receives the reference clock $CK_{REF}$ and modifies the pulse width of the reference clock $CK_{REF}$ to provide a control signal $CK_{PWM}$ to the pumping switch 240.

The pumping switch 240 is controlled by the control signal $CK_{PWM}$ from the PWM 210. When the pumping switch 240 is turned on by the control signal $CK_{PWM}$, the track and hold charge pump 200A is operating in a charging state, and is capable of providing a pumping current Ip to the LPF 130 in FIG. 1 according to the current $I_{OTA}$. As described above, The LPF 130 of FIG. 1 filters a pumping signal $S_{N1}$ corresponding to the pumping current Ip to provide the control voltage $V_{CTRL}$, so as to control the VCO 140 in the PLL 100 of FIG. 1. Conversely, when the pumping switch 240 is turned off by the control signal $CK_{PWM}$, the track and hold charge pump 200A is operating in a discharging state, and no pumping current Ip is provided.

In some embodiments, a single pumping switch (i.e. the pumping switch 240) is used in the track and hold charge pump 200A, thereby avoiding mismatch between an up switch (e.g. a charging switch for charging a loop filter) and a down switch (e.g. a discharging switch for discharging the loop filter) that are commonly used in a general PLL in other approaches. The mismatch between the up and down switches in other approaches leads to worse spur performance for a charge pump.

Figure 2B:
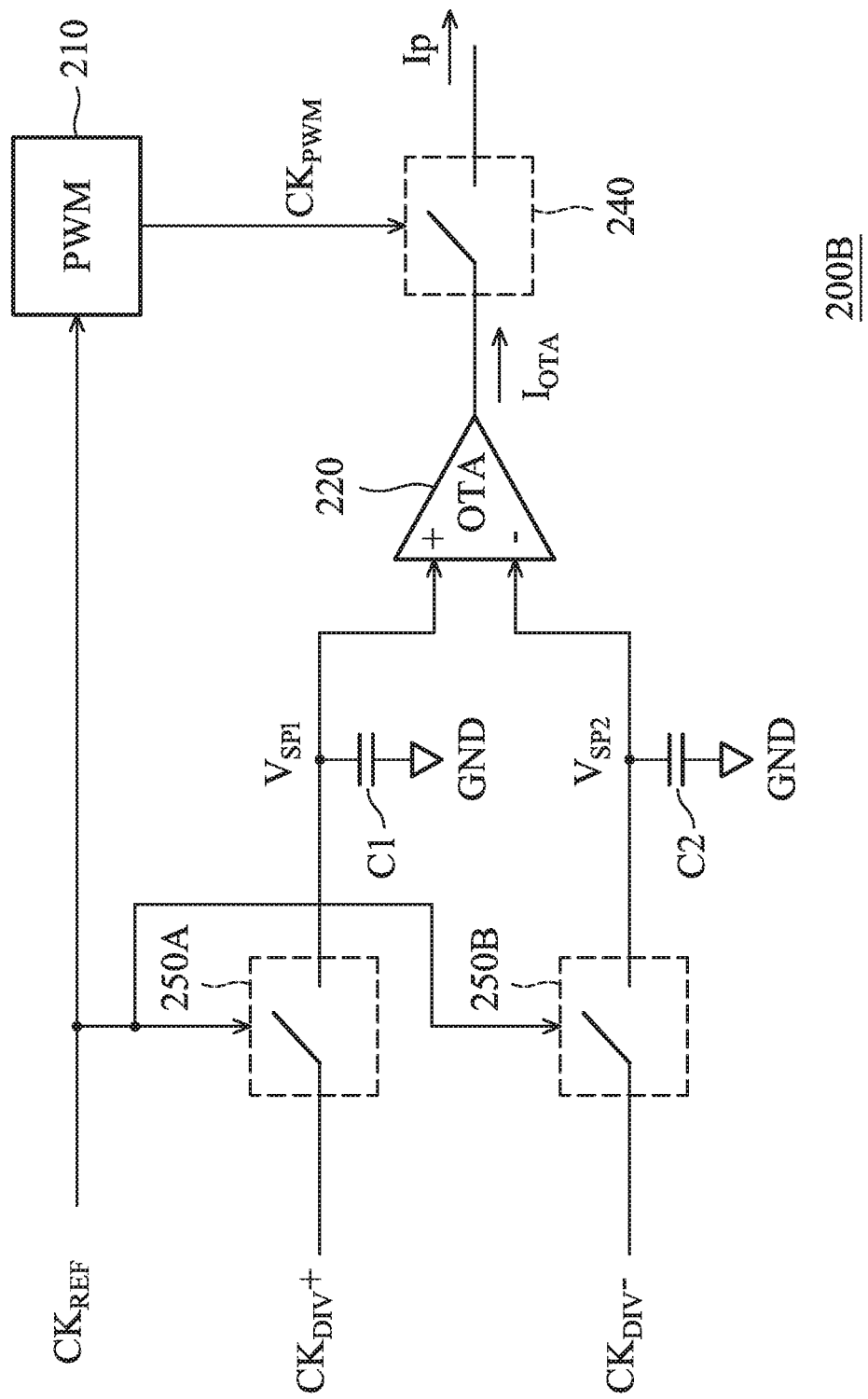
FIG. 2B shows a track and hold charge pump, in accordance with some embodiments of the disclosure.

FIG. 2B shows a track and hold charge pump 200B illustrating another exemplified block diagram of the track and hold charge pump 110 of FIG. 1, in accordance with some embodiments of the disclosure. The track and hold charge pump 200B includes a pulse width modulator 210, a pumping switch 240, an OTA 220, two sampling switches 250A and 250B, and two capacitive elements C1 and C2.

The sampling switch 250A is coupled to the capacitive element C1 and a non-inverting input terminal of the OTA 220, and the capacitive element C1 is coupled between the non-inverting input terminal of the OTA 220 and a ground GND. The sampling switch 250B is coupled to the capacitive element C2 and an inverting input terminal of the OTA 220, and the capacitive element C2 is coupled between the inverting input terminal of the OTA 220 and the ground GND. The sampling switches 250A and 250B are controlled by the reference clock $CK_{REF}$ together. When the sampling switch 250A is turned on by the reference clock $CK_{REF}$, the feedback signal $CK_{DIV+}$ is sampled and stored in the capacitive element C1 as a voltage $V_{SP1}$. Simultaneously, the sampling switch 250B is also turned on by the reference clock $CK_{REF}$, and the feedback signal $CK_{DIV-}$ is sampled and stored in the capacitive element C2 as a voltage $V_{SP2}$.

The OTA 220 is capable of converting a voltage difference between the voltages $V_{SP1}$ and $V_{SP2}$ into a current $I_{OTA}$. In such embodiments, the OTA 220 is operated in the differential-ended form (or mode).

As described above, the PWM 210 receives the reference clock $CK_{REF}$ and modifies the pulse width of the reference clock $CK_{REF}$ to provide a control signal $CK_{PWM}$ to the pumping switch 240, so as to control the pumping switch 240. When the pumping switch 240 is turned on by the control signal $CK_{PWM}$, the track and hold charge pump 200B is operating in a charging state, and is capable of providing a pumping current Ip to the LPF 130 of FIG. 1 according to the current $I_{OTA}$. Furthermore, The LPF 130 filters the pumping signal $S_{N1}$ corresponding to the pumping current Ip to provide the control voltage $V_{CTRL}$, so as to control the VCO 140 in the PLL 100 of FIG. 1. Conversely, when the pumping switch 240 is turned off by the control signal $CK_{PWM}$, the track and hold charge pump 200B is operating in a discharging state, and no pumping current Ip is provided.

In some embodiments, a single pumping switch (i.e. the pumping switch 240) is used in the track and hold charge pump 200B, thereby avoiding mismatch between an up switch (e.g. a charging switch for charging a loop filter) and a down switch (e.g. a discharging switch for discharging the loop filter) that are commonly used in a general PLL in other approaches. The mismatch between the up and down switches in other approaches leads to worse spur performance for a charge pump.

For analog PLLs, the process, supply voltage, and temperature (PVT) variations give rise to not only uncertainty of the VCO gain but also uncertainty of the current of charge pump. Therefore, bandwidth stabilization, tracking, or optimization techniques are highly desirable.

The bandwidth (also called loop bandwidth, noise bandwidth or single-sided loop bandwidth) determines the frequency and phase lock time of a PLL. Since the PLL is a negative feedback system, phase margin and stability issues must be considered. Many of these parameters are interactive for a PLL. For example, lower values of bandwidth lead to reduced levels of phase noise and reference spurs, but at the expense of longer lock times and less phase margin.

When the bandwidth is widened, an output signal of the PLL can be tracked more quickly, but the jitters on the output signal are increased. A narrow bandwidth will have more trouble tracking the output signal, but will result in a cleaner signal and will give a more accurate representation of the output signal.

If the bandwidth is very narrow, the PLL will have trouble acquiring and maintaining an accurate phase lock. A very narrow bandwidth will reject most noise and will give a very clean output signal. However, it is hard to maintain a phase lock on a noisy signal as the time between lock losses can be proportional to the SNR of the output signal. Furthermore, a wider bandwidth is needed for PLL applications where the signal becomes noisy or where it is not so vital for the clock to be absolutely accurate. A bandwidth calibration circuit is used in a PLL to automatically adjust bandwidth of the PLL. Operations of the PLLs having the bandwidth calibration circuit will be described below.

Figure 3:
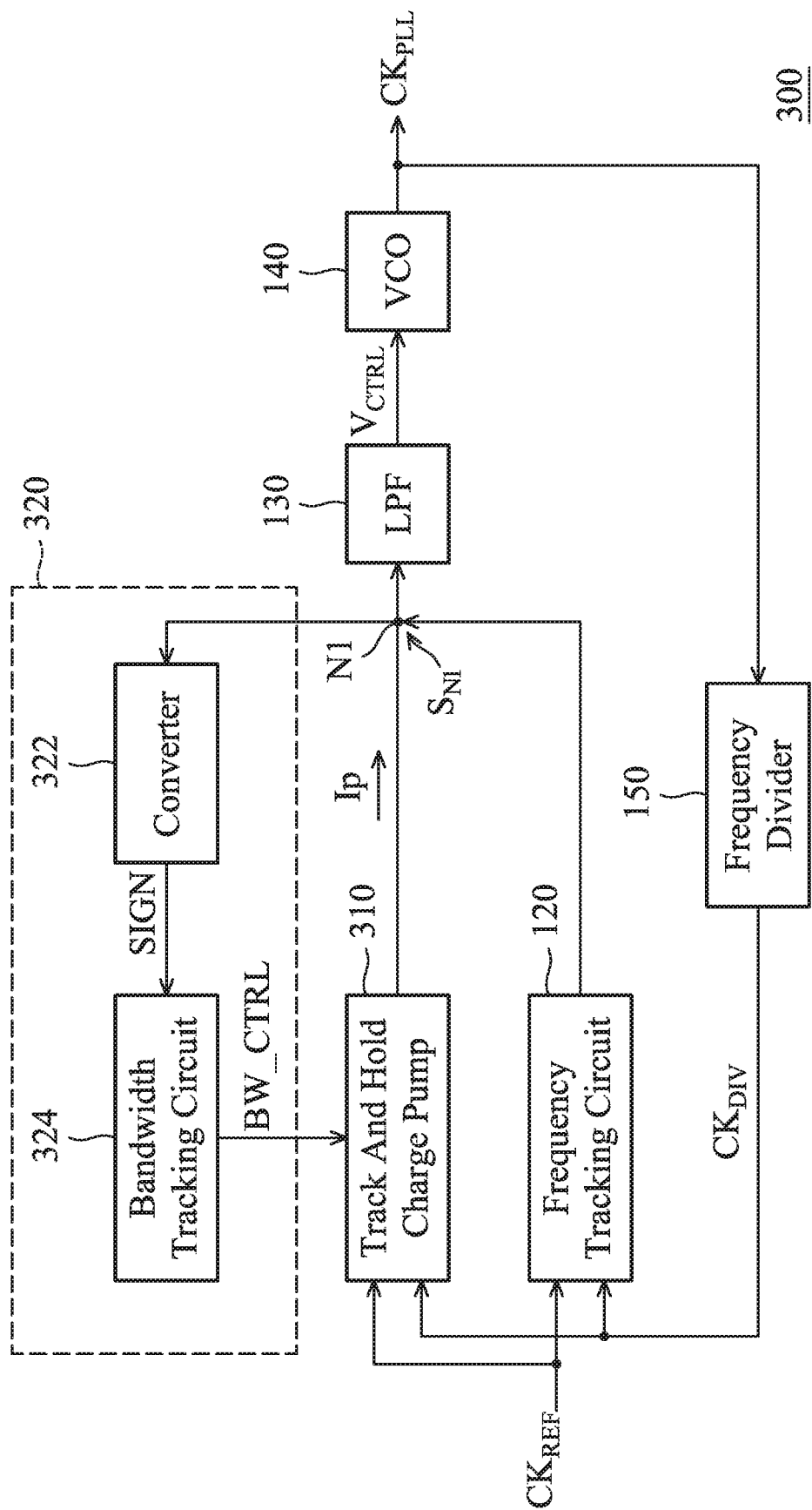
FIG. 3 shows a PLL, in accordance with some embodiments of the disclosure.

FIG. 3 shows a PLL 300 capable of automatically adjusting bandwidth, in accordance with some embodiments of the disclosure. The PLL 300 is an analog PLL capable of multiplying a low-frequency reference clock $CK_{REF}$ to generate a high-frequency output clock $CK_{PLL}$. The PLL 300 includes a track and hold charge pump 310, a frequency tracking circuit 120, a low pass filter 130, a VCO 140, a frequency divider 150, and a bandwidth calibration circuit 320.

Compared with the PLL 100 of FIG. 1, the PLL 300 further includes the bandwidth calibration circuit 320 coupled to the LPF 130 via the node N1. The bandwidth calibration circuit 320 is capable of providing a bandwidth control signal BW_CTRL to control a charge pump gain of the track and hold charge pump 310. In some embodiments, the charge pump gain is equivalent to the current magnitude of the pumping current Ip provided by the track and hold charge pump 310, and the pumping current Ip can be formulated according to the following formula (1):

$$I_P = Gm \times \frac{W}{t_r} \times V_{DD}, \quad (1)$$

where Gm represents the gain (e.g. transconductance) of the OTA within the track and hold charge pump 310, W represents the pulse width of a control signal $CK_{PWM}$ from a PWM within the track and hold charge pump 310, $V_{DD}$ represents a supply voltage of the track and hold charge pump 310, and $t_r$ represents the rise time of the feedback signal $CK_{DIV}$. The control signal $CK_{PWM}$ will be described below.

In some embodiments, the bandwidth calibration circuit 320 includes a converter 322 and a bandwidth tracking circuit 324. In response to the pumping signal $S_{N1}$ at the node N1 corresponding to the pumping current Ip, the converter 322 provides a logic signal SIGN to indicate whether the track and hold charge pump 310 is in a charging state or a discharging state. The bandwidth tracking circuit 324 provides the bandwidth control signal BW_CTRL according to the logic signal SIGN, so as to control the bandwidth of the PLL 300 by changing the charge pump gain of the track and hold charge pump 310.

For the PLL 300, the bandwidth is associated with the pumping current Ip. Therefore, in order to change the bandwidth of the PLL 300, the bandwidth calibration circuit 320 is capable of providing the bandwidth control signal BW_CTRL to change the gain of the OTA (e.g. Gm), the pulse width of the control signal $CK_{PWM}$ (e.g. W), or a slew rate of the feedback signal $CK_{DIV}$ corresponding to the rise time (e.g. $t_r$), so as to change the pumping current Ip.

Figure 4A:
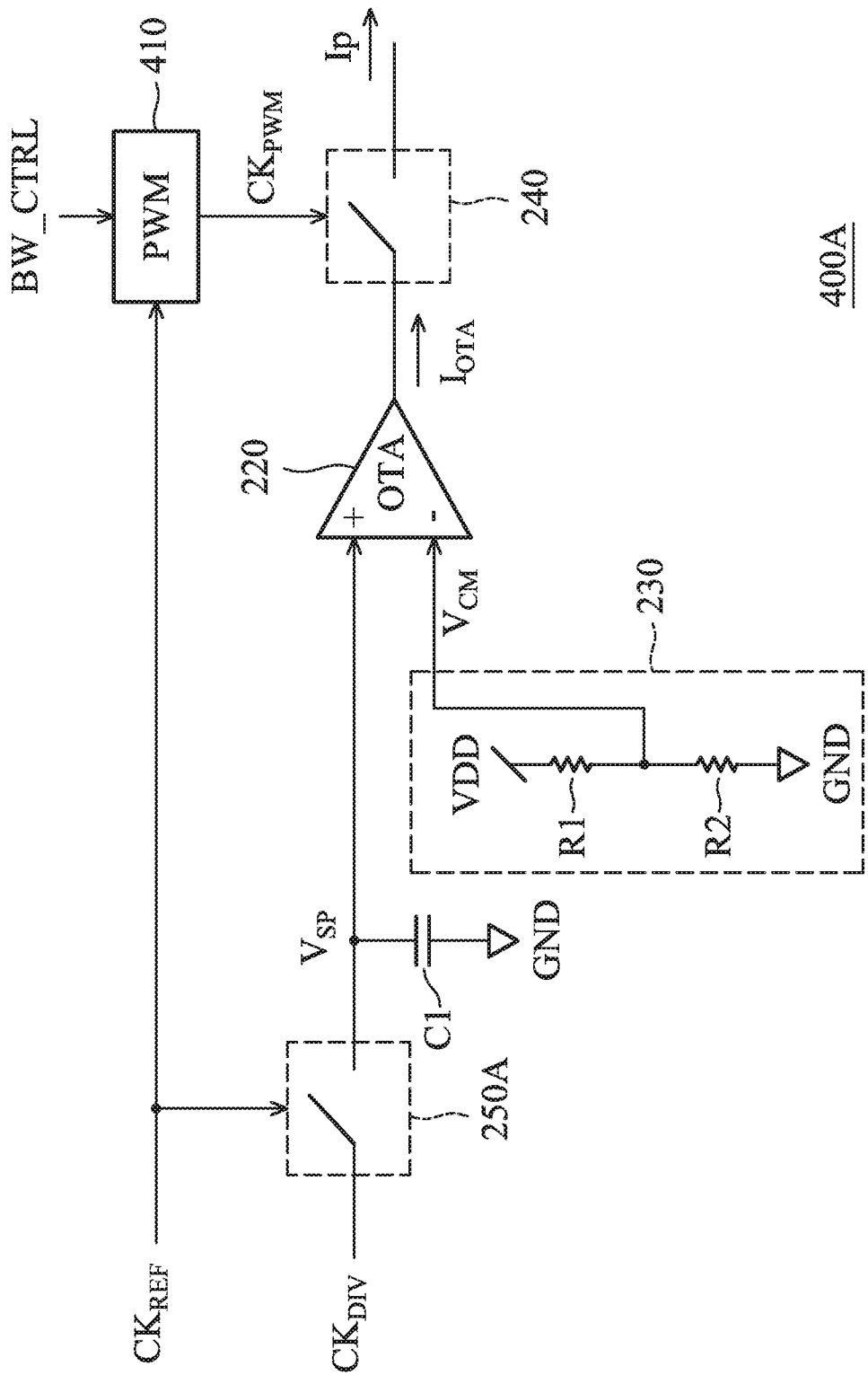
FIG. 4A shows a track and hold charge pump with an adjustable pulse width, in accordance with some embodiments of the disclosure.

FIG. 4A shows a track and hold charge pump 400A with an adjustable pulse width illustrating an exemplified block diagram of the track and hold charge pump 310 of FIG. 3, in accordance with some embodiments of the disclosure. The track and hold charge pump 400A includes a pulse width modulator 410, a pumping switch 240, an OTA 220, a sampling switch 250A, a capacitive element C1, and a voltage divider 230.

Compared with the track and hold charge pump 200A of FIG. 2A, the PWM 410 receives the reference clock $CK_{REF}$, and modifies the pulse width of the reference clock $CK_{REF}$ according to the bandwidth control signal BW_CTRL in the track and hold charge pump 400A, so as to provide a control signal $CK_{PWM}$ to the pumping switch 240. Specifically, the pulse width of the control signal $CK_{PWM}$ is adjustable according to the bandwidth control signal BW_CTRL.

Referring to FIG. 3 and FIG. 4A together, when the pumping switch 240 is turned on by the control signal $CK_{PWM}$, the track and hold charge pump 400A is operating in a charging state, and is capable of providing a pumping current Ip to the LPF 130 of FIG. 3 according to the current $I_{OTA}$. Furthermore, the LPF 130 filters the pumping signal $S_{N1}$ corresponding to the pumping current Ip to provide the control voltage $V_{CTRL}$, so as to control the VCO 140 in the PLL 300 of FIG. 3. Conversely, when the pumping switch 240 is turned off by the control signal $CK_{PWM}$, the track and hold charge pump 400A is operating in a discharging state, and no pumping current Ip is provided.

According to the previous formula (1), when the pulse width (e.g. W) of the control signal $CK_{PWM}$ is increased by the bandwidth control signal BW_CTRL, the pumping current Ip is increased, and then the bandwidth of the PLL 300 of FIG. 3 is increased. Conversely, when the pulse width of the control signal $CK_{PWM}$ is decreased by the bandwidth control signal BW_CTRL, the pumping current Ip is decreased, and then the bandwidth of the PLL 300 of FIG. 3 is decreased.

Figure 4B:
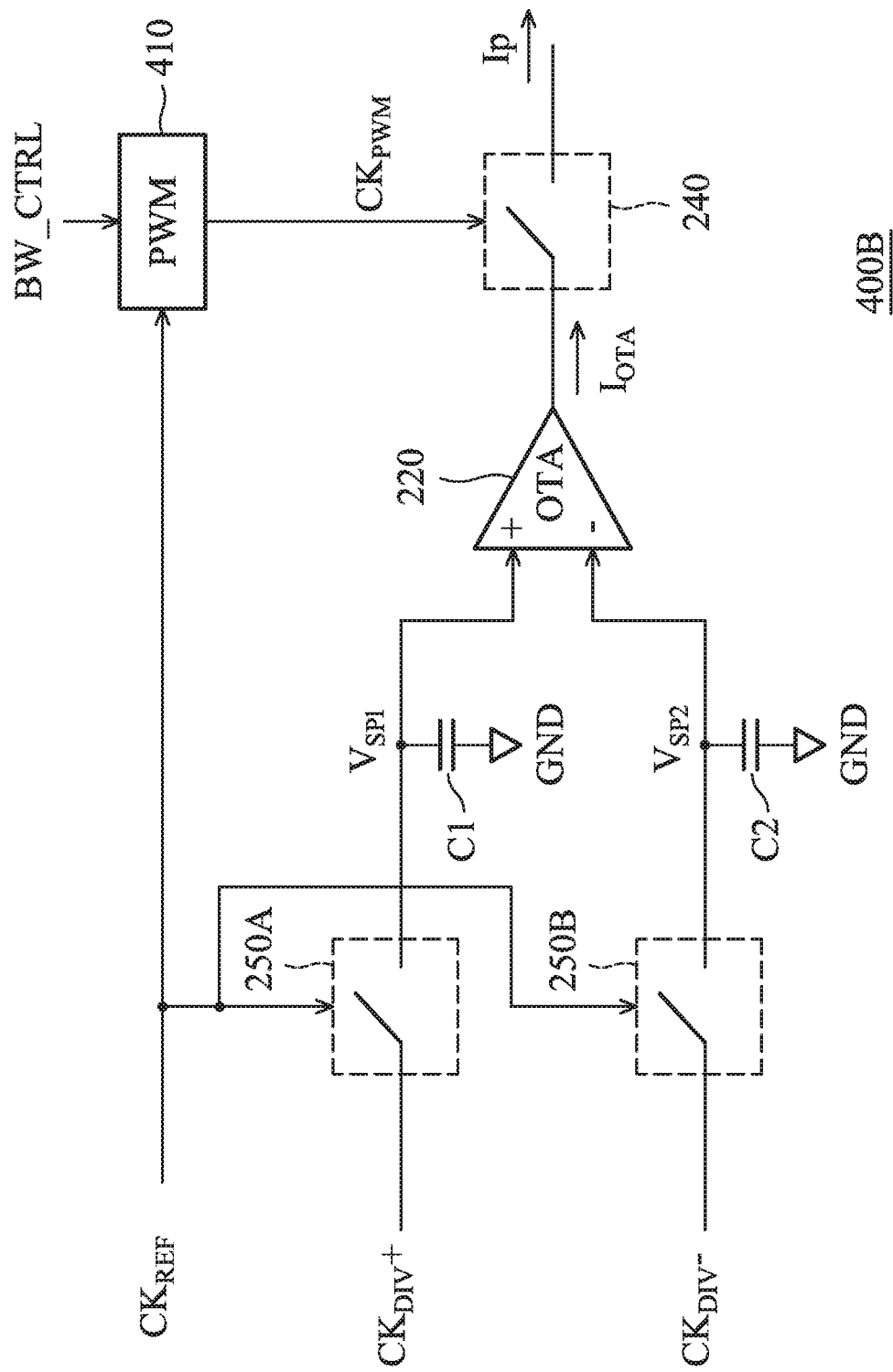
FIG. 4B shows a track and hold charge pump with an adjustable pulse width, in accordance with some embodiments of the disclosure.

FIG. 4B shows a track and hold charge pump 400B with an adjustable pulse width illustrating another exemplified block diagram of the track and hold charge pump 310 of FIG. 3, in accordance with some embodiments of the disclosure. The track and hold charge pump 400B includes a pulse width modulator 410, a pumping switch 240, an OTA 220, two sampling switches 250A and 250B, and two capacitive elements C1 and C2.

In the track and hold charge pump 400B, the OTA 220 is operated in the differential-ended form. Compared with the track and hold charge pump 200B of FIG. 2B, the PWM 410 receives the reference clock $CK_{REF}$, and modifies the pulse width of the reference clock $CK_{REF}$ further according to the bandwidth control signal BW_CTRL in the track and hold charge pump 400B, so as to provide a control signal $CK_{PWM}$ to the pumping switch 240. Specifically, the pulse width of the control signal $CK_{PWM}$ is adjustable according to the bandwidth control signal BW_CTRL.

By using the bandwidth control signal BW_CTRL to modify the pulse width of the control signal $CK_{PWM}$ (i.e. the on and off states of the pumping switch 240), the pumping current Ip can be changed so as to change the bandwidth of the PLL 300 of FIG. 3.

Figure 5A:
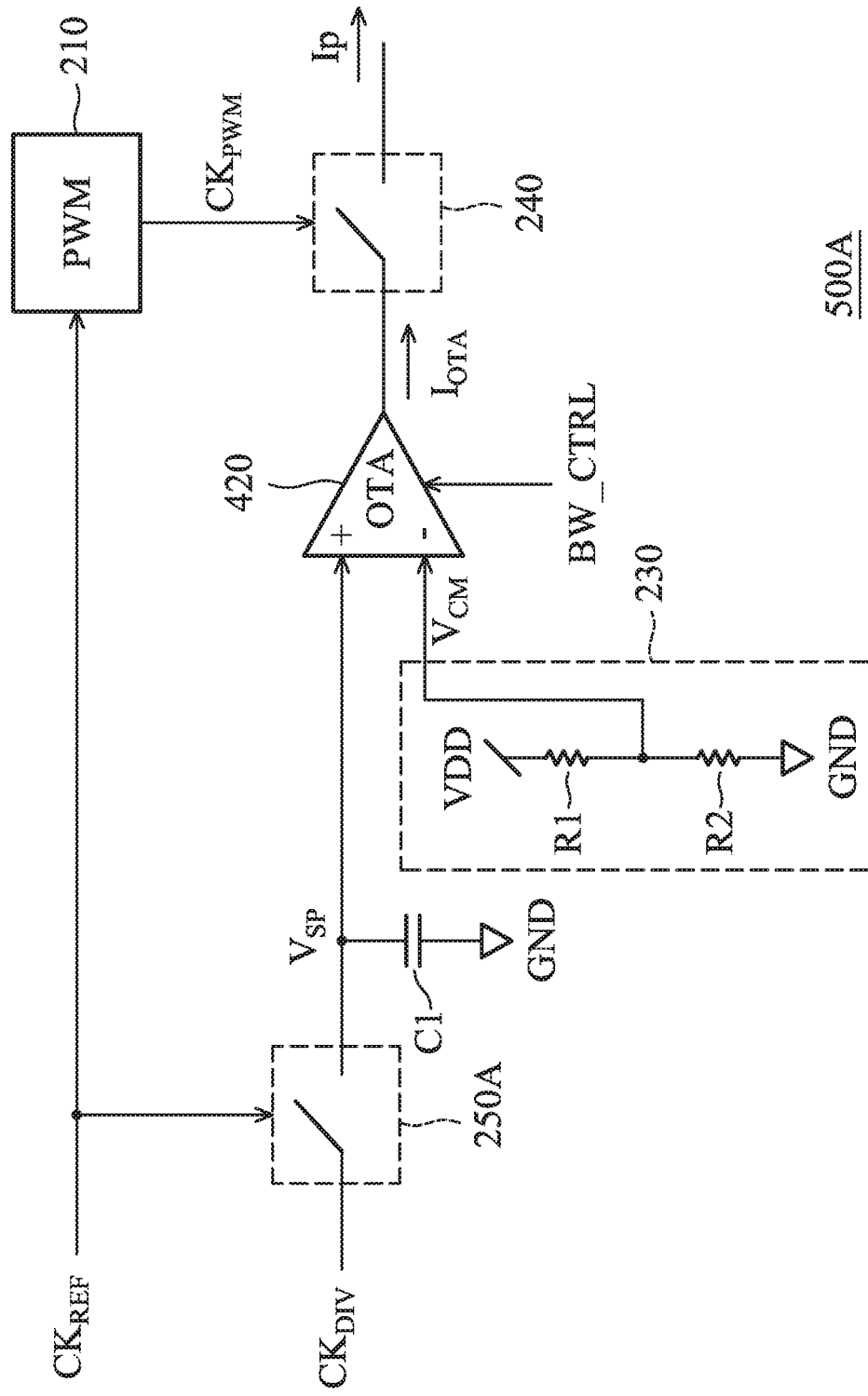
FIG. 5A shows a track and hold charge pump with an adjustable transconductance (Gm), in accordance with some embodiments of the disclosure.

FIG. 5A shows a track and hold charge pump 500A with an adjustable transconductance (Gm) illustrating another exemplified block diagram of the track and hold charge pump 310 of FIG. 3, in accordance with some embodiments of the disclosure. The track and hold charge pump 500A includes a pulse width modulator 210, a pumping switch 240, an OTA 420, a sampling switch 250A, a capacitive element C1, and a voltage divider 230.

Compared with the track and hold charge pump 200A of FIG. 2A, the OTA 420 is an amplifier with an adjustable Gm. The OTA 420 converts a voltage difference between the voltage $V_{SP}$ and the reference voltage $V_{CM}$ into a current $I_{OTA}$ according to the bandwidth control signal BW_CTRL. In such embodiments, the OTA 420 is operated in the single-ended form.

According to the previous formula (1), when the gain of the OTA 420 is increased by the bandwidth control signal BW_CTRL, the current $I_{OTA}$ is increased, and then the pumping current Ip is increased. Furthermore, the bandwidth of the PLL 300 of FIG. 3 is increased when the pumping current Ip is increased. Conversely, when the gain of the OTA 420 is decreased by the bandwidth control signal BW_CTRL, the pumping current Ip is decreased due to the current $I_{OTA}$ being decreased, and then the bandwidth of the PLL 300 of FIG. 3 is decreased.

Figure 5B:
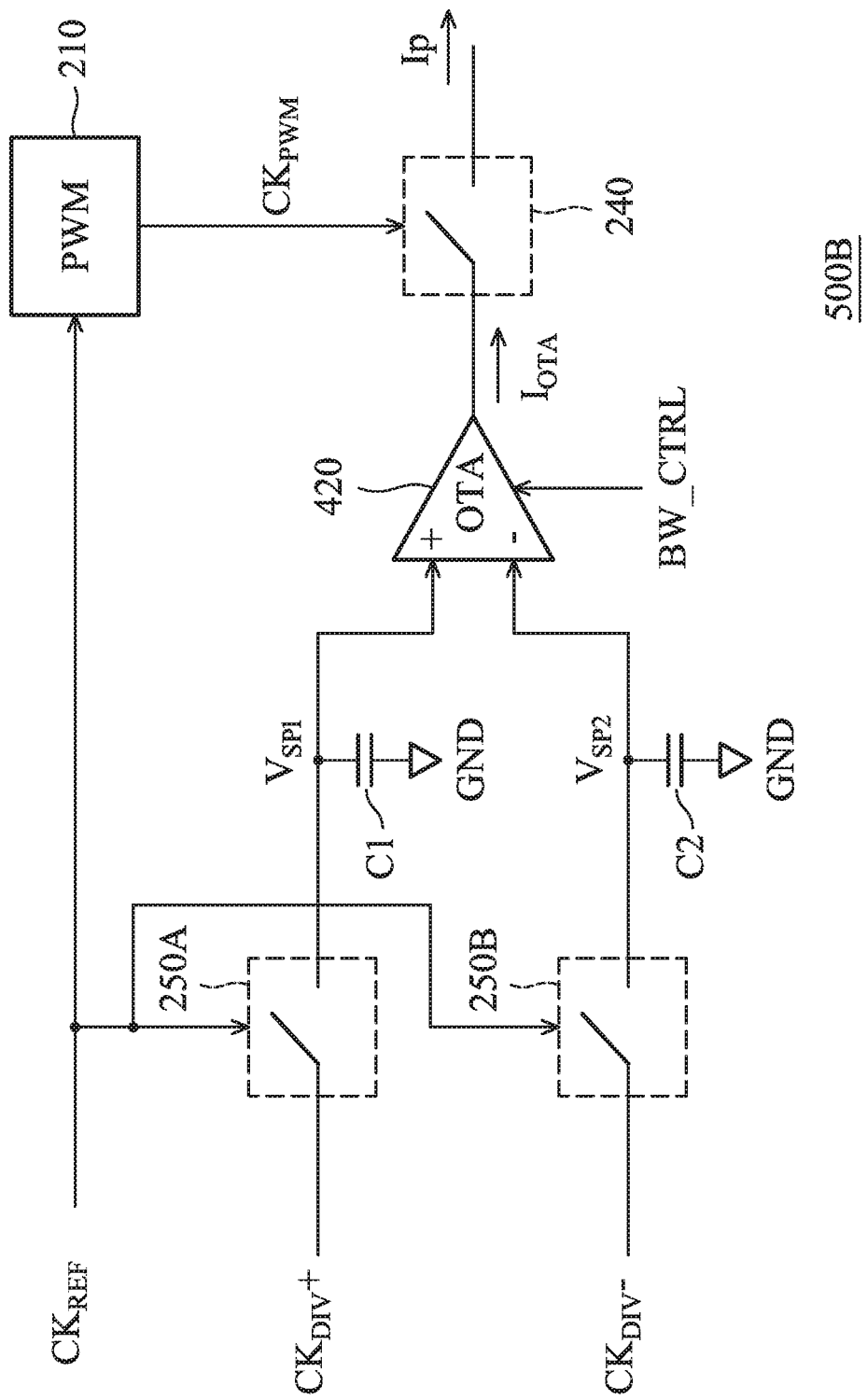
FIG. 5B shows a track and hold charge pump with an adjustable Gm, in accordance with some embodiments of the disclosure.

FIG. 5B shows a track and hold charge pump 500B with an adjustable Gm illustrating another exemplified block diagram of the track and hold charge pump 310 of FIG. 3, in accordance with some embodiments of the disclosure. The track and hold charge pump 500B includes a pulse width modulator 210, a pumping switch 240, an OTA 420, two sampling switches 250A and 250B, and two capacitive elements C1 and C2.

In the track and hold charge pump 500B, the OTA 420 is operated in the differential-ended form. Compared with the OTA 220 of FIG. 2B, the OTA 420 is capable of converting a voltage difference between the voltage $V_{SP1}$ stored in the capacitive element C1 and the voltage $V_{SP2}$ stored in the capacitive element C2 into a current $I_{OTA}$ according to the bandwidth control signal BW_CTRL. Therefore, by using the bandwidth control signal BW_CTRL to control the gain of the OTA 420, the current $I_{OTA}$ is changed in response to the controlled gain of the OTA 420. As described above, the bandwidth of the PLL 300 is associated with the pumping current Ip, and the pumping current Ip can be changed in response to the changed current $I_{OTA}$ so as to change the bandwidth of the PLL 300 of FIG. 3.

Figure 6A:
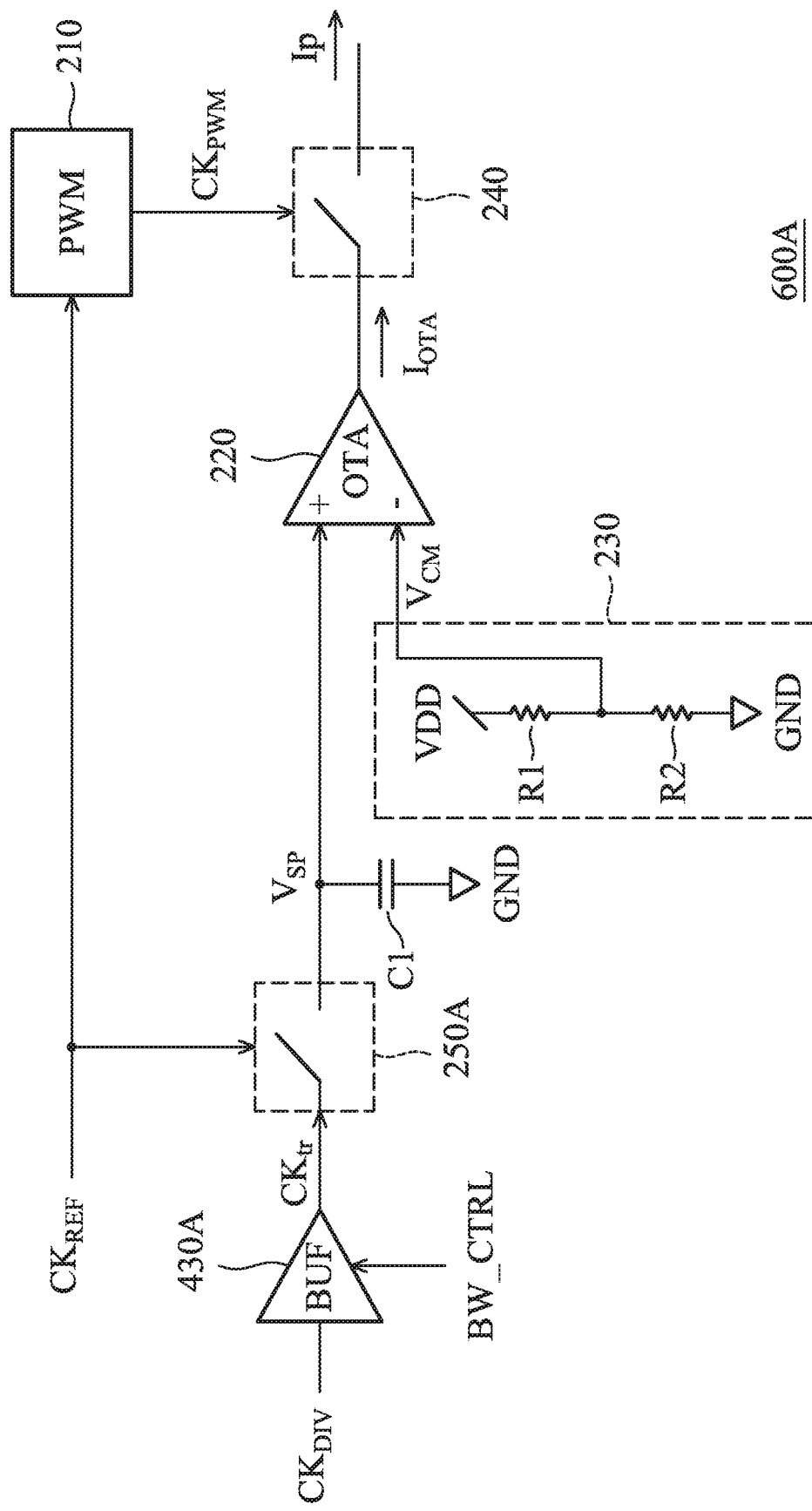
FIG. 6A shows a track and hold charge pump with an adjustable slew rate, in accordance with some embodiments of the disclosure.

FIG. 6A shows a track and hold charge pump 600A with an adjustable slew rate illustrating another exemplified block diagram of the track and hold charge pump 310 of FIG. 3, in accordance with some embodiments of the disclosure. The track and hold charge pump 600A includes a pulse width modulator 210, a pumping switch 240, an OTA 220, a sampling switch 250A, a capacitive element C1, a voltage divider 230, and a buffer (BUF) 430A.

Compared with the track and hold charge pump 200A of FIG. 2A, the track and hold charge pump 600A further includes the buffer 430A coupled to the sampling switch 250A. The buffer 430A receives the feedback signal $CK_{DIV}$, and changes the rise time $t_r$ of the feedback signal $CK_{DIV}$ to provide a signal $CK_{tr}$ according to the bandwidth control signal BW_CTRL. Therefore, slew rate (defined as the change of voltage per unit of time) of the feedback signal $CK_{DIV}$ is changed by the buffer 430A. In some embodiments, the buffer 430A is a driver with an adjustable drive capability capable of changing the rise time $t_r$ of the feedback signal $CK_{DIV}$, and the drive capability is determined according to the bandwidth control signal BW_CTRL. Various circuits implemented as the buffer 430A are within the contemplated scope of the present disclosure.

As described above, when the sampling switch 250A is turned on by the reference clock $CK_{REF}$, the signal $CK_{tr}$ is sampled and stored in the capacitive element C1 as a voltage $V_{SP}$. The OTA 220 converts a voltage difference between the voltage $V_{SP}$ and the reference voltage $V_{CM}$ into a current $I_{OTA}$. In such embodiments, the OTA 220 is operated in the single-ended form.

The PWM 210 receives the reference clock $CK_{REF}$, and modifies the pulse width of the reference clock $CK_{REF}$, so as to provide a control signal $CK_{PWM}$ to the pumping switch 240.

According to the previous formula (1), when the slew rate (i.e. $t_r$) of the feedback signal $CK_{DIV}$ is decreased via the buffer 430A controlled by the bandwidth control signal BW_CTRL, the pumping current Ip is increased. Moreover, the bandwidth of the PLL 300 is increased when the pumping current Ip is increased. Conversely, when the slew rate of the feedback signal $CK_{DIV}$ is increased by the bandwidth control signal BW_CTRL, the pumping current Ip is decreased, and then the bandwidth of the PLL 300 of FIG. 3 is decreased.

Figure 6B:
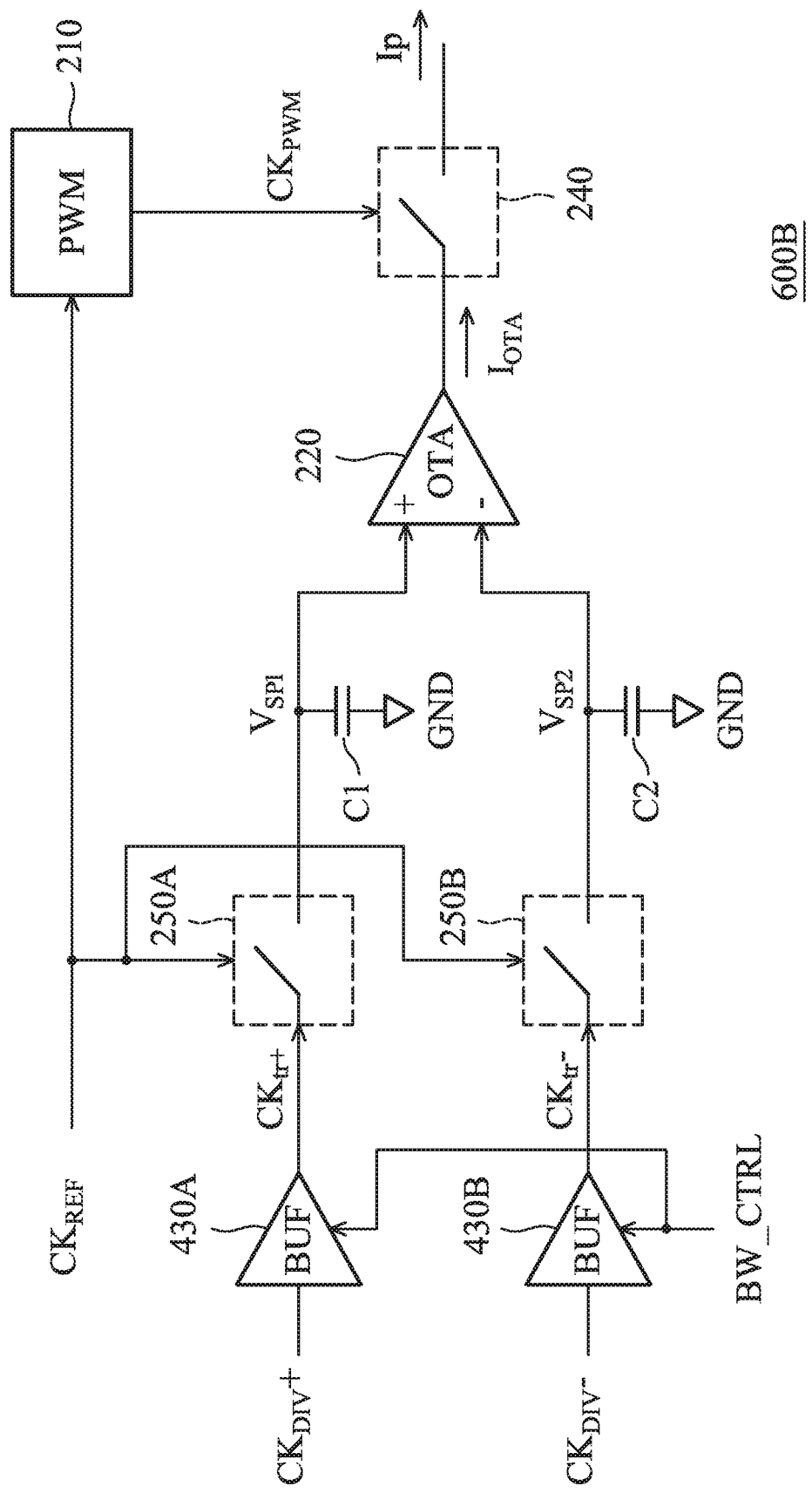
FIG. 6B shows a track and hold charge pump with an adjustable slew rate, in accordance with some embodiments of the disclosure.

FIG. 6B shows a track and hold charge pump 600B with an adjustable slew rate illustrating another exemplified block diagram of the track and hold charge pump 310 of FIG. 3, in accordance with some embodiments of the disclosure. The track and hold charge pump 600B includes a pulse width modulator 210, a pumping switch 240, an OTA 220, two sampling switches 250A and 250B, two capacitive elements C1 and C2, and two buffers 430A and 430B.

Compared with the track and hold charge pump 200B of FIG. 2B, the track and hold charge pump 600B further includes the buffers 430A and 430B coupled to the sampling switches 250A and 250B, respectively. The buffer 430A receives the feedback signal $CK_{DIV+}$, and changes the rise time $t_r$ of the feedback signal $CK_{DIV+}$ to provide a signal $CK_{tr+}$ according to the bandwidth control signal BW_CTRL. Simultaneously, the buffer 430B receives the feedback signal $CK_{DIV-}$, and changes the rise time $t_r$ of the feedback signal $CK_{DIV-}$ to provide a signal $CK_{tr-}$ according to the bandwidth control signal BW_CTRL. Therefore, the slew rates of the feedback signals $CK_{DIV+}$ and $CK_{DIV-}$ are changed.

The buffers 430A and 430B have the same circuit and structure. In some embodiments, the buffers 430A and 430B are the drivers with an adjustable drive capability capable of changing the rise time $t_r$ of the feedback signals $CK_{DIV+}$ and $CK_{DIV-}$, and the drive capability is determined according to the bandwidth control signal BW_CTRL.

By using the bandwidth control signal BW_CTRL to control the slew rate of the feedback signals $CK_{DIV+}$ and $CK_{DIV-}$, the pumping current Ip can be changed so as to change the bandwidth of the PLL 300 of FIG. 3.

Figure 7:
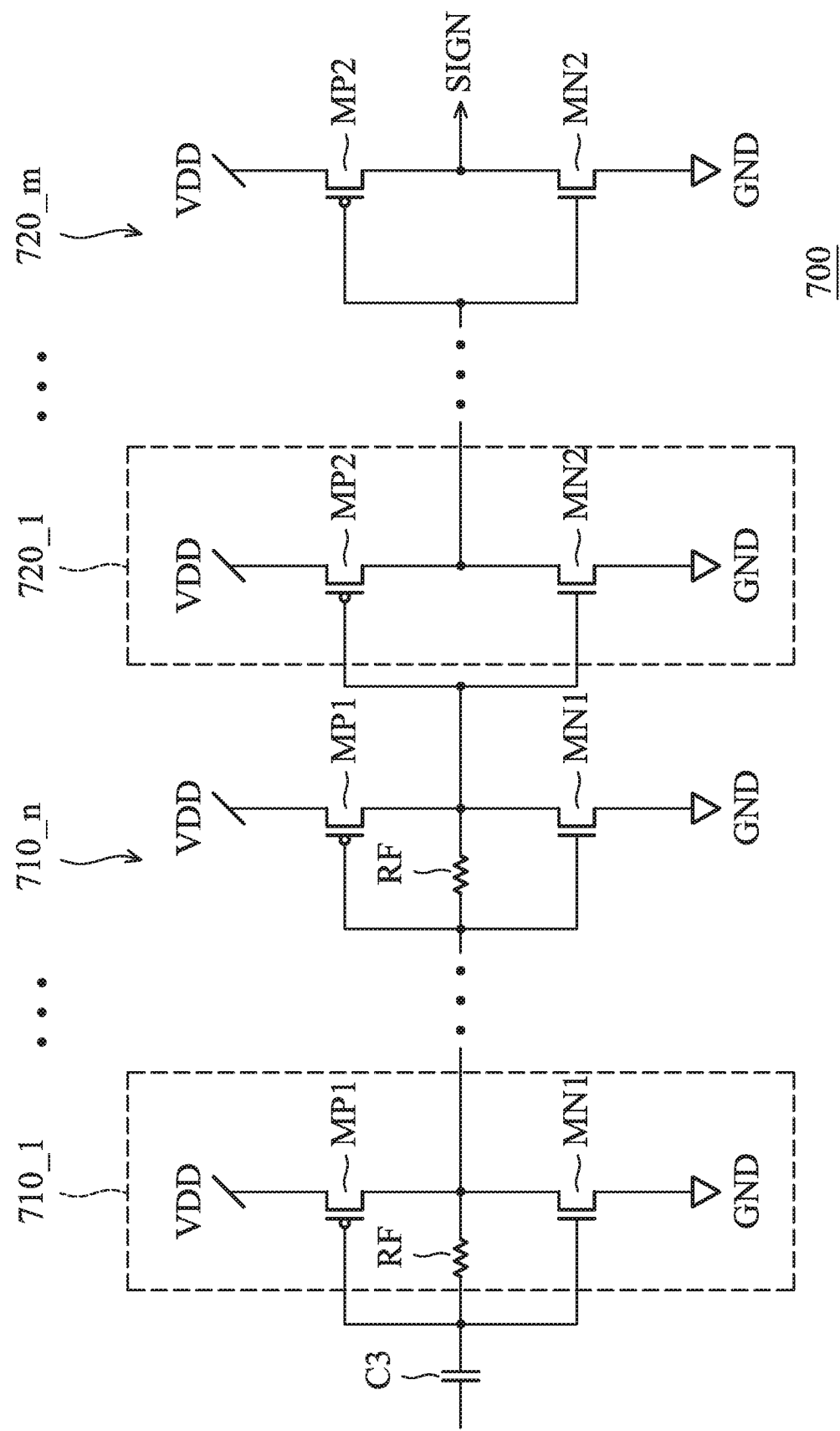
FIG. 7 shows a converter, in accordance with some embodiments of the disclosure.

FIG. 7 shows a converter 700 illustrating an exemplified block diagram of the converter 322 of FIG. 3, in accordance with some embodiments of the disclosure. The converter 700 is a single-ended amplifier that includes a capacitive element C3, a string of self-biased inverters 710_1-710_n, and a string of inverters 720_1-720_n.

The capacitive element C3 is an alternating current (AC) coupling capacitive element coupled between the self-biased inverter 710_1 and the node N1 of the PLL 300 of FIG. 3, and the self-biased inverter 710_1 is an input self-biased inverter of the string of self-biased inverters 710_1-710_n. Furthermore, the AC component of the pumping signal $S_{N1}$ corresponding to the pumping current Ip at the node N1 of the PLL 300 of FIG. 3 is coupled and input to the self-biased inverter 710_1 via the capacitive element C3.

The self-biased inverters 710_1-710_n are coupled in series. Each of the self-biased inverters 710_1-710_n includes a PMOS transistor MP1, an NMOS transistor MN1, and a feedback resistor RF. The PMOS transistor MP1 and the NMOS transistor MN1 form an inverter, and the feedback resistor RF is coupled between the input and output terminals of the inverter. In some embodiments, the self-biased inverter is used as a small-signal amplifier for amplifying the AC component of the pumping signal SN1.

The inverters 720_1-720_m are coupled in series, and the inverter 720_1 is coupled to the self-biased inverter 710_n. Each of the inverters 720_1-720_m includes a PMOS transistor MP2 and an NMOS transistor MN2.

It should be noted that the number of biased inverters 710_1-710_n and the number of inverters 720_1-720_m can be adjusted as long as the gain is enough to convert the AC component of the pumping signal $S_{N1}$ into the logic signal SIGN.

In some embodiments, the logic signal SIGN can be represented by "+1" or "−1". For example, the logic signal SIGN with "+1" indicates that the track and hold charge pump is in a charging state, and the logic signal SIGN with "−1" indicates that the track and hold charge pump is in a discharging state.

Figure 8:
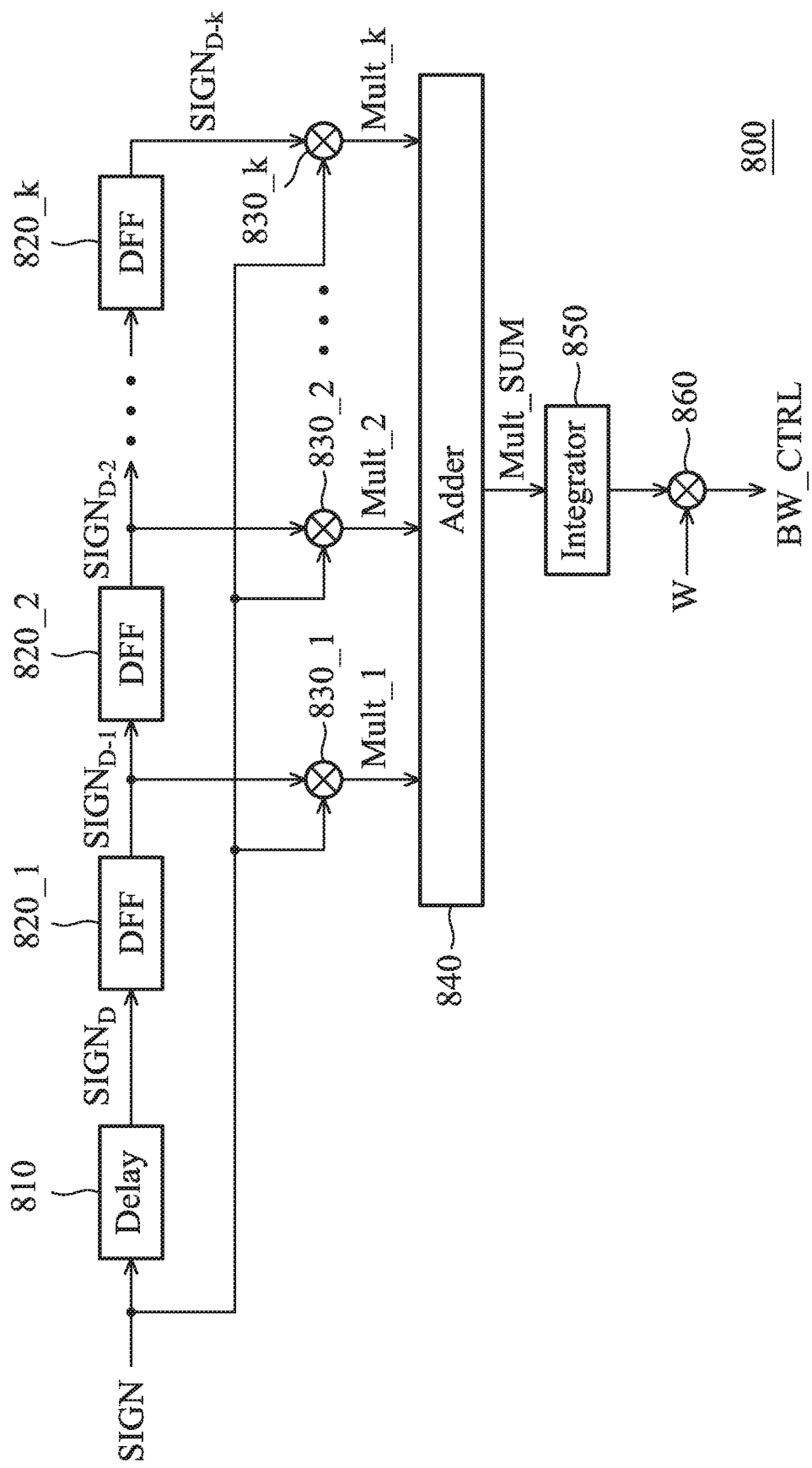
FIG. 8 shows a bandwidth tracking circuit, in accordance with some embodiments of the disclosure.

FIG. 8 shows a bandwidth tracking circuit 800 illustrating an exemplified block diagram of the bandwidth tracking circuit 324 of FIG. 3, in accordance with some embodiments of the disclosure. The bandwidth tracking circuit 800 includes a delay unit 810, multiple D flip-flops (DFFs) 820_1-820_k, multiple multipliers 830_1-830_k, an adder 840, an integrator 850 and a multiplier 860.

The delay unit 810 is used to delay the logic signal SIGN into the DFFs 820_1-820_k. For example, after an output clock $CK_{PLL}$ of a PLL has been locked, the delay unit 810 provides the delayed logic signal $SIGN_D$ to the DFFs 820_1-820_k. In some embodiments, the desired latency of the delay unit 810 is implemented by inserting some DFFs.

The DFFs 820_1-820_k are coupled in series to shift the delayed logic signal $SIGN_D$ in response to a specific clock (e.g. the output clock $CK_{PLL}$ or the reference clock $CK_{REF}$). In some embodiments, the number of DFFs 820_1-820_k is determined according to a minimal variable (e.g. resolution) of the bandwidth of the PLL.

The number of DFFs 820_1-820_k is identical to the number of multipliers 830_1-830_k. Each of the multipliers 830_1-830_k is capable of multiplying the logic signal SIGN by the delayed logic signal from the corresponding DFF to obtain a multiplication output. For example, the multiplier 830_1 multiplies the logic signal SIGN by the delayed logic signal $SIGN_{D-1}$ from the DFF 820_1 to obtain a multiplication output Mult_1, the multiplier 830_2 multiplies the logic signal SIGN by the delayed logic signal $SIGN_{D-2}$ from the DFF 820_2 to obtain a multiplication output Mult_2, and so on.

The adder 840 sums the multiplication outputs Mult_1-Mult_k to obtain the sum Mult_SUM. The sum Mult_SUM is integrated by the integrator 850. The multiplier 860 multiplies the integrated sum Mult_SUM by a weight value W to obtain the bandwidth control signal BW_CTRL, and the weight value W is determined according to actual application.

In some embodiments, the bandwidth control signal BW_CTRL can be formulated according to the following formula (2):

$$BW\_CTRL_n = BW\_CTRL_{n-1} + w \times (SIGN_n \times SIGN_{n-D-1} + SIGN_{n-D-2} + \ldots + SIGN_n \times SIGN_{n-D-k}) \quad (2),$$

where n denotes the iteration cycle and D denotes the delayed time provided by the delay unit 810.

Figure 9:
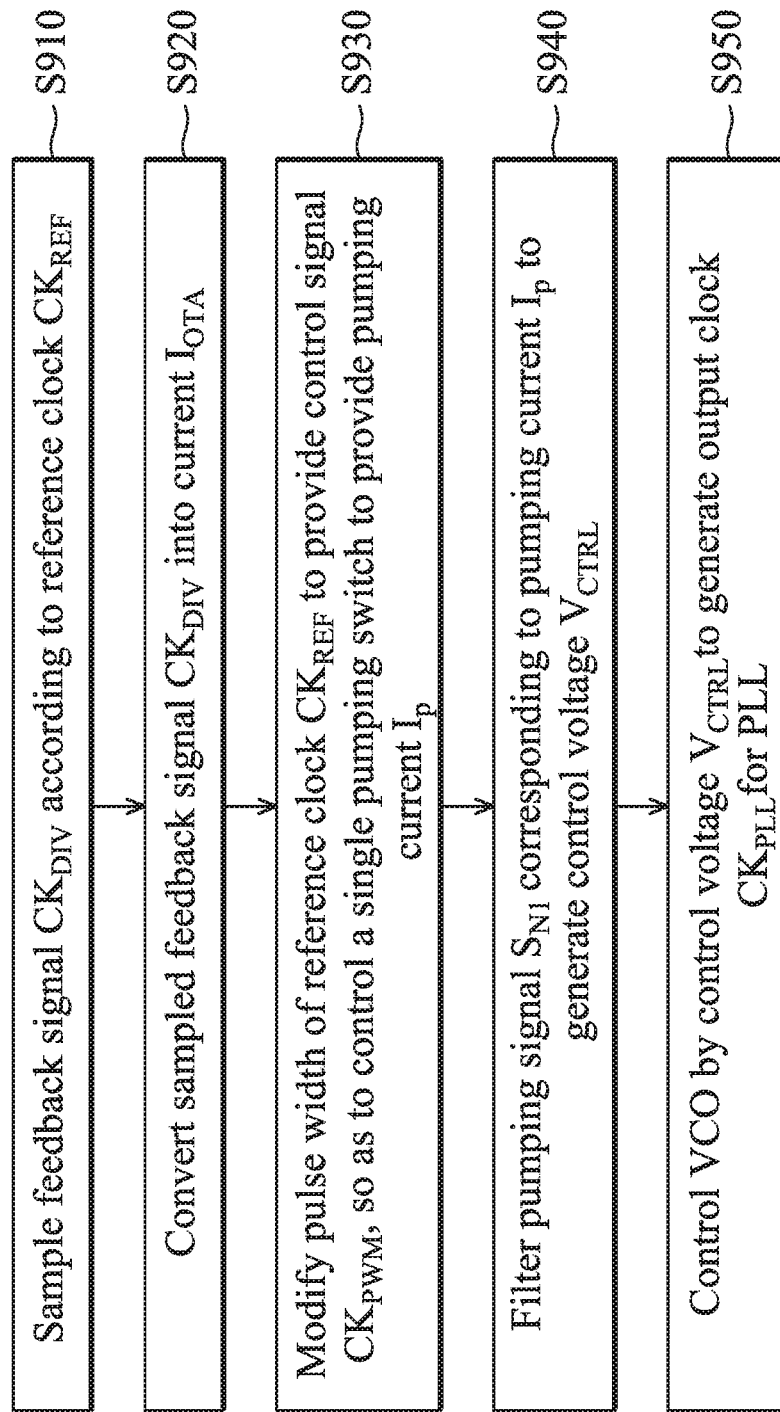
FIG. 9 shows a flow chart illustrating the operations of a PLL, in accordance with some embodiments of the disclosure.

FIG. 9 shows a flow chart illustrating the operations of a PLL (e.g. 100 of FIGS. 1 and 300 of FIG. 3), in accordance with some embodiments of the disclosure. The PLL includes a track and hold charge pump 110/310, a low pass filter 130, a VCO 140, and a frequency divider 150.

In operation S910, a feedback signal $CK_{DIV}$ from the frequency divider 150 is sampled according to a reference clock $CK_{REF}$ in the track and hold charge pump 110/310. In some embodiments, the frequency divider 150 is capable of providing a pair of different feedback signals $CK_{DIV+}$ and $CK_{DIV-}$, and the pair of different feedback signals is simultaneously sampled according to the reference clock $CK_{REF}$ in the track and hold charge pump 110/310.

In operation S920, the sampled feedback signal $CK_{DIV}$ is converted into a current $I_{OTA}$ by an OTA 220/420 in the track and hold charge pump 110/310. In some embodiments, a voltage difference between the sampled feedback signal $CK_{DIV}$ and a reference voltage $V_{CM}$ is converted into the current $I_{OTA}$. In some embodiments, a voltage difference between the sampled feedback signals $CK_{DIV+}$ and $CK_{DIV-}$ is converted into the current $I_{OTA}$.

In operation S930, the pulse width of the reference clock $CK_{REF}$ is modified to provide the control signal $CK_{PWM}$, and a single pumping switch 240 is controlled by the control signal $CK_{PWM}$ to provide a pumping current Ip according to the current $I_{OTA}$. As described above, the pumping current Ip is proportional to the difference between the phases of the feedback signal $CK_{DIV}$ and the reference clock $CK_{REF}$.

In operation S940, a pumping signal $S_{N1}$ corresponding to the pumping current Ip is filtered by the low pass filter 130, thereby generating a control voltage $V_{CTRL}$.

In operation S950, the VCO 140 is controlled by the control voltage $V_{CTRL}$ to generate an output clock $CK_{PLL}$ for the PLL. Furthermore, the output clock $CK_{PLL}$ is divided by frequency divider, to provide the feedback signal $CK_{DIV}$.

As described above, the bandwidth of the PLL 300 of FIG. 3 is associated with the pumping current Ip. Therefore, the PLL 300 may further include a bandwidth calibration circuit 320 capable of providing a bandwidth control signal BW_CTRL to change the pumping current Ip, so as to automatically adjust bandwidth of the PLL 300.

In some embodiments, before the feedback signal $CK_{DIV}$ is sampled (in operation S910), the bandwidth control signal BW_CTRL is provided to change a slew rate of the feedback signal $CK_{DIV}$, so as to change the pumping current Ip.

In some embodiments, the bandwidth control signal BW_CTRL is provided to change the gain of the OTA 420 of FIGS. 5A and 5B in operation S920. When the gain of the OTA 420 is increased by the bandwidth control signal BW_CTRL, the current $I_{OTA}$ is increased, and then the pumping current Ip is increased. Conversely, when the gain of the OTA 420 is decreased by the bandwidth control signal BW_CTRL, the pumping current Ip is decreased due to the current $I_{OTA}$ being decreased.

In some embodiments, the bandwidth control signal BW_CTRL is provided to change the pulse width of the control signal $CK_{PWM}$ in operation S930, so as to change the pumping current Ip.

Embodiments for track-and-hold charge pumps and PLLs for tolerating PVT variations are provided. The track-and-hold charge pump includes a track-and-hold circuit for sampling an input signal according to a reference clock, an OTA for converting the sampled input signal into a current, a pulse width modulator for providing a PWM signal according to the reference clock, and a single pumping switch. The pumping switch is controlled by the PWM signal to provide an output current according to the current. It should be noted that a single pumping switch is used in the track-and-hold charge pump, thereby avoiding charge pump noise and spurs. Furthermore, by changing the pulse width of the PWM signal, a Gm of the OTA, or a slew rate of the input signal, the current magnitude of the output current is changed when the slew rate is changed. In a PLL, by changing the output current of the charge pump with a bandwidth calibration circuit, the bandwidth of the PLL is changed automatically. Therefore, if VCO noise is greater, the bandwidth calibration circuit will provide the bandwidth control signal BW_CTRL with the higher value. Conversely, if VCO noise is lesser, the bandwidth calibration circuit will provide the bandwidth control signal BW_CTRL with the lower value.

In some embodiments, a phase-locked loop (PLL) is provided. The PLL includes a voltage-controlled oscillator (VCO), a frequency divider, a track-and-hold charge pump, and a frequency tracking circuit. The VCO is configured to provide an output clock corresponding to a pumping current. The frequency divider is configured to divide the output clock to provide a feedback signal. The track-and-hold charge pump is configured to provide the pumping current according to a reference clock and the feedback signal. The frequency tracking circuit is configured to decrease frequency error between the feedback signal and the reference clock. The track-and-hold charge pump includes a pumping switch and a pulse width modulator (PWM). The PWM is configured to provide a PWM signal to control the pumping switch according to the reference clock, so as to provide the pumping current corresponding to the feedback signal.

In some embodiments, a PLL is provided. The PLL includes a voltage-controlled oscillator (VCO), a low pass filter (LPF), a track-and-hold charge pump coupled to the LPF, and a bandwidth calibration circuit coupled to the LPF. The VCO is configured to provide an output clock according to a control voltage. The LPF is configured to filter a pumping signal corresponding to a pumping current to provide the control voltage. The track-and-hold charge pump is configured to provide the pumping current according to a reference signal and a feedback signal corresponding to the output clock. The bandwidth calibration circuit is configured to provide a control signal to the track-and-hold charge pump, so as to adjust the pumping current.

In some embodiments, a PLL is provided. The PLL includes a voltage-controlled oscillator (VCO), a low pass filter (LPF), a frequency divider, and a track-and-hold charge pump coupled to the LPF. The VCO is configured to provide an output clock according to a control voltage. The LPF is configured to filter a pumping signal corresponding to a pumping current to provide the control voltage. The frequency divider is configured to divide the output clock to provide a feedback signal. The track-and-hold charge pump is configured to provide the pumping current according to a reference clock and the feedback signal. The track-and-hold charge pump includes a track-and-hold circuit, a transconductance amplifier, a pulse width modulator (PWM) and a pumping switch. The track-and-hold circuit is configured to sample the feedback signal according to the reference clock. The transconductance amplifier is configured to convert the sampled feedback signal into a current. The PWM is configured to provide a PWM signal according to the reference clock. The pumping switch is coupled between the transconductance amplifier and the LPF. The pumping switch is controlled by the PWM signal, to provide the pumping current according to the current.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phase-locked loop (PLL), comprising:
    a voltage-controlled oscillator (VCO) configured to provide an output clock corresponding to a pumping current;
    a frequency divider configured to divide the output clock to provide a feedback signal;
    a track-and-hold charge pump configured to provide the pumping current according to a reference clock and the feedback signal; and
    a frequency tracking circuit configured to decrease frequency error between the feedback signal and the reference clock, wherein the track-and-hold charge pump comprises:
    a pumping switch; and
    a pulse width modulator (PWM) configured to provide a PWM signal to control the pumping switch according to only the reference clock, so as to provide the pumping current corresponding to the feedback signal.

2. The PLL as claimed in claim 1, wherein a bandwidth of the PLL is changed when a pulse width of the PWM signal, a transconductance of a transconductance amplifier, or a slew rate of the feedback signal is changed.

3. The PLL as claimed in claim 1, wherein the track-and-hold charge pump further comprises:
    a track-and-hold circuit coupled to the frequency divider configured to sample the feedback signal according to the reference clock; and
    a transconductance amplifier (OTA) configured to convert the sampled feedback signal into a current,
    wherein the pumping switch is coupled to the transconductance amplifier, and the pumping switch is controlled by the PWM signal to provide the pumping current according to the current.

4. The PLL as claimed in claim 1, further comprising:
    a converter coupled to an output of the track-and-hold charge pump and configured to convert a pumping signal corresponding to the pumping current into a logic signal; and
    a bandwidth tracking circuit configured to control a charge pump gain of the track-and-hold charge pump according to the logic signal,
    wherein the logic signal indicates whether the pumping switch is turned on by the PWM signal.

5. The PLL as claimed in claim 4, wherein the converter comprises:
    a string of self-biased inverters;

a capacitive element coupled between the output of the track-and-hold charge pump and an input self-biased inverter of the string of self-biased inverters; and a string of inverters coupled between the string of self-biased inverters and the bandwidth tracking circuit.

6. The PLL as claimed in claim 5, wherein the string of self-biased inverters amplifies an alternating current (AC) component of the pumping signal to obtain an amplified signal, and the string of inverters converts the amplified signal into the logic signal.

7. The PLL as claimed in claim 4, wherein the bandwidth tracking circuit comprises:

a plurality of flip-flops coupled in series, wherein the logic signal is input to a first flip-flop of the flip-flops;

a plurality of first multipliers corresponding to the flip-flops, wherein each first multiplier multiplies the logic signal by an output of the corresponding flip-flop to provide a first value;

an adder configured to sum the first values to obtain a second value;

an integrator configured to integrate the second value; and a second multiplier configured to multiply the integrated second value by a weight value to provide the control signal, so as to change a pulse width of the PWM signal, a transconductance of the transconductance amplifier, or a slew rate of the feedback signal.

8. A phase-locked loop (PLL), comprising:

a voltage-controlled oscillator (VCO) configured to provide an output clock according to a control voltage;

a low pass filter (LPF) configured to filter a pumping signal corresponding to a pumping current to provide the control voltage;

a track-and-hold charge pump input coupled to the LPF and configured to provide the pumping current according to a reference signal and a feedback signal corresponding to the output clock; and a bandwidth calibration circuit coupled to the LPF and configured to provide a control signal to the track-and-hold charge pump, so as to adjust the pumping current.

9. The PLL as claimed in claim 8, wherein the bandwidth calibration circuit comprises:

a converter coupled to the LPF configured to convert the pumping signal into a logic signal; and a bandwidth tracking circuit configured to provide the control signal to control the pumping signal according to the logic signal, wherein the logic signal indicates whether the pumping current is provided.

10. The PLL as claimed in claim 9, wherein the converter comprises:

a string of self-biased inverters;

a capacitive element coupled between the LPF and an input self-biased inverter of the string of self-biased inverters; and a string of inverters coupled between the string of self-biased inverters and the bandwidth tracking circuit.

11. The PLL as claimed in claim 10, wherein the string of self-biased inverters amplifies an alternating current (AC) component of the pumping signal to obtain an amplified signal, and the string of inverters converts the amplified signal into the logic signal.

12. The PLL as claimed in claim 9, wherein the bandwidth tracking circuit comprises:

a plurality of flip-flops coupled in series, wherein the logic signal is input to a first flip-flop of the flip-flops;

a plurality of first multipliers corresponding to the flip-flops, wherein each first multiplier multiplies the logic signal by an output of the corresponding flip-flop to provide a first value;

an adder configured to sum the first values to obtain a second value;

an integrator configured to integrate the second value; and a second multiplier configured to multiply the integrated second value by a weight value to provide the control signal.

13. The PLL as claimed in claim 8, wherein the track-and-hold charge pump comprises:

a track-and-hold circuit configured to sample the feedback signal according to the reference signal;

a transconductance amplifier (OTA) configured to convert the sampled feedback signal into a current;

a pumping switch coupled between the transconductance amplifier and the LPF; and a pulse width modulator (PWM) configured to provide a PWM signal to control the pumping switch according to the reference signal, so as to provide the pumping signal according to the current.

14. The PLL as claimed in claim 13, wherein the PWM modifies a pulse width of the PWM signal according to the control signal, and magnitude of the pumping signal is changed when a pulse width of the PWM signal is changed by the control signal.

15. The PLL as claimed in claim 13, wherein the transconductance amplifier converts the sampled input signal into the current according to a transconductance, and magnitude of the pumping signal is changed when the transconductance is changed by the control signal.

16. The PLL as claimed in claim 13, wherein the track-and-hold charge pump further comprises:

a buffer coupled to the track-and-hold circuit configured to provide the input signal with a slew rate to the track-and-hold circuit, wherein magnitude of the pumping signal is changed when the slew rate is changed by the control signal.

17. A phase-locked loop (PLL), comprising:

a voltage-controlled oscillator (VCO) configured to provide an output clock according to a control voltage;

a low pass filter (LPF) configured to filter a pumping signal corresponding to a pumping current to provide the control voltage;

a frequency divider configured to divide the output clock to provide a feedback signal; and a track-and-hold charge pump coupled to the LPF and configured to provide the pumping current according to a reference clock and the feedback signal;

wherein the track-and-hold charge pump comprises:

a track-and-hold circuit configured to sample the feedback signal according to the reference clock;

a transconductance amplifier configured to convert the sampled feedback signal into a current;

a pulse width modulator (PWM) configured to provide a PWM signal according to the reference clock; and a pumping switch coupled between the transconductance amplifier and the LPF, wherein the pumping switch is controlled by the PWM signal, to provide the pumping current according to the current.

18. The PLL as claimed in claim 17, wherein the PWM modifies a pulse width of the PWM signal according to a control signal, and current magnitude of the pumping current is changed when a pulse width of the PWM signal is changed by the control signal.

19. The PLL as claimed in claim 17, wherein the transconductance amplifier converts the sampled feedback signal into the current according to a transconductance, and current magnitude of the pumping current is changed when the transconductance is changed.

20. The PLL as claimed in claim 17, wherein the track-and-hold charge pump further comprises:
- a buffer coupled to the track-and-hold circuit configured to provide the feedback signal with a slew rate to the track-and-hold circuit,
- wherein current magnitude of the pumping current is changed when the slew rate is changed.

* * * * *